United States Patent
Yin et al.

(10) Patent No.: US 12,002,685 B2
(45) Date of Patent: Jun. 4, 2024

(54) METHOD FOR PACKAGING CHIP

(71) Applicant: Weifang Goertek Microelectronics Co., Ltd., Shandong (CN)

(72) Inventors: Baoguan Yin, Shandong (CN); Fei She, Shandong (CN); Dewen Tian, Shandong (CN); Qinglin Song, Shandong (CN)

(73) Assignee: Weifang Goertek Microelectronics Co., Ltd., Shandong (CN)

( * ) Notice: Subject to any disclaimer, the term of this patent is extended or adjusted under 35 U.S.C. 154(b) by 97 days.

(21) Appl. No.: 17/620,345

(22) PCT Filed: Dec. 6, 2019

(86) PCT No.: PCT/CN2019/123551
§ 371 (c)(1),
(2) Date: Dec. 17, 2021

(87) PCT Pub. No.: WO2020/253146
PCT Pub. Date: Dec. 24, 2020

(65) Prior Publication Data
US 2022/0367209 A1    Nov. 17, 2022

(30) Foreign Application Priority Data
Jun. 17, 2019  (CN) .......................... 201910522476.4

(51) Int. Cl.
*H01L 21/44*  (2006.01)
*H01L 21/48*  (2006.01)
*H01L 21/56*  (2006.01)

(52) U.S. Cl.
CPC ...... *H01L 21/4875* (2013.01); *H01L 21/4878* (2013.01); *H01L 21/56* (2013.01)

(58) Field of Classification Search
CPC ........................... H01L 21/56; H01L 21/4875
(Continued)

(56) References Cited

U.S. PATENT DOCUMENTS 5,976,912 A  *  11/1999  Fukutomi ........... H01L 23/3121
                                                          257/E23.125
6,001,671 A  *  12/1999  Fjelstad ................ H01L 21/568
                                                          438/126
(Continued)

FOREIGN PATENT DOCUMENTS

CN        101656246 A       2/2010
CN        104576517 A       4/2015
(Continued)

*Primary Examiner* — Nitin Parekh
(74) *Attorney, Agent, or Firm* — Baker Botts, LLP

(57) ABSTRACT

Disclosed is a method for packaging a chip, comprising the following steps: providing a baseplate formed with an open slot thereon penetrating through opposite sides of the baseplate; providing a release base material, wherein the release base material is bonded to a first side of the baseplate and covers the open slot; providing a chip, wherein the chip is mounted on the release base material at the position of the open slot; packaging a second side of the baseplate facing away from the release base material so as to form a packaging layer which packages the chip and fixes it on the baseplate; removing the release base material so as to obtain a package structure for the chip.

9 Claims, 6 Drawing Sheets

(58) Field of Classification Search
USPC .......................................................... 438/106
See application file for complete search history.

(56) References Cited

U.S. PATENT DOCUMENTS

| | | | | |
|---|---|---|---|---|
| 6,111,306 A * | 8/2000 | Kawahara | ............. | H01L 21/568 |
| | | | | 257/668 |
| 6,140,707 A * | 10/2000 | Plepys | .................... | H01L 21/50 |
| | | | | 257/668 |
| 6,340,846 B1 * | 1/2002 | LoBianco | ............... | H01L 24/83 |
| | | | | 257/E21.705 |
| 6,353,263 B1 * | 3/2002 | Dotta | ...................... | H01L 24/75 |
| | | | | 257/E21.705 |
| 6,621,172 B2 * | 9/2003 | Nakayama | .......... | H01L 25/0657 |
| | | | | 257/E23.125 |
| 7,008,822 B2 * | 3/2006 | Bolken | ............... | H01L 23/3135 |
| | | | | 438/126 |
| 7,956,449 B2 * | 6/2011 | Lee | .................... | H01L 21/6835 |
| | | | | 438/109 |
| 7,981,796 B2 * | 7/2011 | Lam | ...................... | H01L 21/565 |
| | | | | 438/667 |
| 8,923,004 B2 * | 12/2014 | Low | .................... | H01L 23/3135 |
| | | | | 29/841 |
| 2008/0029908 A1 * | 2/2008 | Chen | ....................... | H01L 23/50 |
| | | | | 257/784 |
| 2016/0005626 A1 * | 1/2016 | van Gemert | ...... | H01L 23/49541 |
| | | | | 257/676 |

FOREIGN PATENT DOCUMENTS

| | | |
|---|---|---|
| CN | 205039151 U | 2/2016 |
| CN | 205264695 U | 5/2016 |
| CN | 110233113 A | 9/2019 |
| KR | 101942747 B1 | 1/2019 |

* cited by examiner

METHOD FOR PACKAGING CHIP

CROSS-REFERENCE TO RELATED APPLICATIONS

This application is a National Stage of International Application No. PCT/CN2019/123551, filed on Dec. 6, 2019, which claims priority to Chinese Patent Application No. 201910522476.4, filed on Jun. 17, 2019, both of which are hereby incorporated by reference in its entirety.

TECHNICAL FIELD

The present disclosure relates to the field of packaging, and particularly, relates to a method for packaging a chip.

BACKGROUND

With the development of electronic products toward miniaturization and thinning, manufacturers have high requirements for packaging a chip. SIP (System In a Package) packaging integrates a variety of functional chips (including processor, memory and other functional chips) into a package to realize a substantially complete function.

For example, for a packaging structure with a small bottom chip and a large top chip, after performing pressure welding on the bottom chip, a support portion is bonded to support the top chip. When packaging through injection molding or film-on-wire (FOW) process, due to the small area between the top chip and the support portion, the packaging structure often faces the problem of incomplete filling, resulting in poor reliability of packaging.

For memory products, in order to increase storage capacity and reduce package size, chip-stacked packaging is often used, where two or more chips are stacked and packaged in the thickness direction through the support portion or the FOW process. Such packaging structures are not conducive to the development of electronic products toward miniaturization and thinning.

SUMMARY

An object of the present disclosure is to provide a new technical solution for a method for packaging a chip.

According to a first aspect of the present disclosure, a method for packaging a chip is provided, which comprises the following steps:
S100: providing a baseplate formed with an open slot thereon penetrating through opposite sides of the baseplate;
S200: providing a release base material, wherein the release base material is bonded to a first side of the baseplate and covers the open slot;
S300: providing a first chip, wherein the first chip is mounted on the release base material at the position of the open slot;
S400: packaging a second side of the baseplate facing away from the release base material so as to form a packaging layer which packages the first chip and fixes it on the baseplate;
S500: removing the release base material so as to obtain a package structure for the first chip.

Optionally, a top surface of the first chip is flush with or lower than a top surface of the baseplate; and the method further comprises, after the step S400, further comprising a step of thinning the packaging layer.

Optionally, in the step S300, the first chip is mounted on the release base material in a manner in which its pins face the release base material; after the step S500, further comprising a step of performing re-distribution on the baseplate.

Optionally, the method further comprises after the step of performing re-distribution, a step of performing cutting to obtain a plurality of separate packaging structures.

Optionally, in the step S300, conducting the first chip to the baseplate through leads; and in the step S400, packaging the first chip and its leads and fixing both on the baseplate; and after that, the method further comprising a step of mounting a second chip on the packaging layer and conducting the second chip to the baseplate through leads; and comprising a step of packaging the second chip, so as to form another packaging layer for packaging the second chip on the baseplate.

Optionally, in the step S300, a first chip is mounted on the release base material in a manner in which its pins face the release base material, a second chip is mounted on the first chip in a manner in which its pins face away from the release base material, and the pins of the second chip are conducted to the baseplate through leads;

the method further comprises in the step S400, packaging the first chip, the second chip and the leads of the second chip and fixing all on the baseplate; and
the method further comprises after the step S500, a step of conducting the pins of the first chip to the baseplate through leads, and a step of further packaging the first chip and its pins from the second side of the baseplate.

Optionally, the method further comprises a further packaging of the first chip and its leads from the second side of the baseplate through a dispensing process.

Optionally, the first chip is of the same size as the second chip.

Optionally, in the step S400, packaging is performed through an injection molding process or a film-on-wire process.

Optionally, the release base material is an adhesive tape, or a pyrolysis film, or a photolysis film, or a baseplate containing a release layer.

According to an embodiment of the present disclosure, it is possible to package the chip on the baseplate at the position of the open slot. This not only improves reliability of the package between the chip and the baseplate, but also reduces space occupied by the chip, especially the thickness of a plurality of stacked chips, thereby reducing the thickness of the entire package, which is conducive to the development of electronic products toward miniaturization and thinning.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which are incorporated in the description and constitute a part of the description, illustrate embodiments of the present disclosure and, together with the description thereof, serve to explain the principles of the present disclosure.

DETAILED DESCRIPTION

Figure 1A:
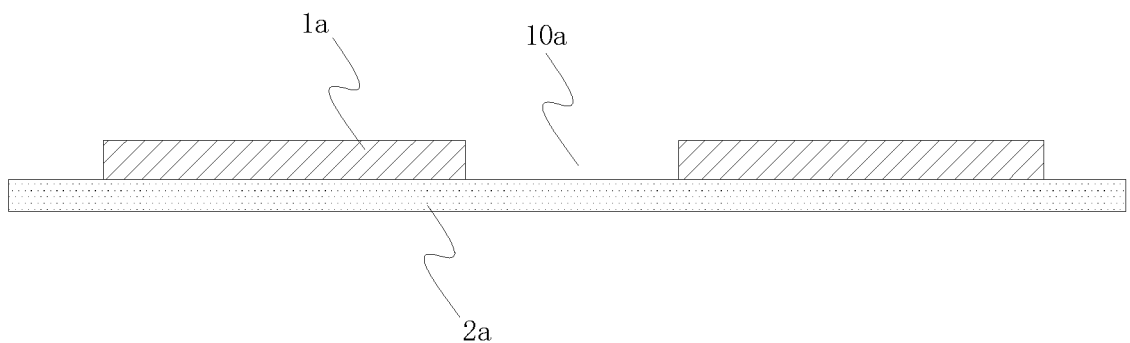
FIG. 1a to 1f are flow charts of the packaging process of a first embodiment of the present disclosure.

Various exemplary embodiments of the present disclosure will now be described in detail with reference to the accompanying drawings. It should be noted that the relative arrangement, numerical expressions and numerical values of the components and steps set forth in these examples do not limit the scope of the disclosure unless otherwise specified.

The following description of at least one exemplary embodiment is in fact merely illustrative and is in no way intended as a limitation to the present disclosure and its application or use.

Techniques, methods, and apparatus known to those of ordinary skill in the relevant art may not be discussed in detail but where appropriate, the techniques, methods, and apparatus should be considered as part of the description.

Among all the examples shown and discussed herein, any specific value should be construed as merely illustrative and not as a limitation. Thus, other examples of exemplary embodiments may have different values.

It should be noted that similar reference numerals and letters denote similar items in the accompanying drawings, and therefore, once an item is defined in a drawing, and there is no need for further discussion in the subsequent accompanying drawings.

The present disclosure provides a method for packaging a chip, comprising the following steps: providing a baseplate formed with an open slot thereon penetrating through opposite sides of the baseplate; providing a release base material, wherein the release base material is bonded to one side of the baseplate and covers the open slot; providing a chip, wherein the chip is mounted on the release base material at the position of the open slot; packaging the other side of the baseplate facing away from the release base material so as to form a packaging layer which packages the chip and fixes it on the baseplate; removing the release base material so as to obtain a package structure for the chip.

With this packaging method, it is possible to package the chip on the baseplate at the position of the open slot. This not only improves reliability of the package between the chip and the baseplate, but also reduces space occupied by the chip, especially the thickness of a plurality of stacked chips, thereby reducing the thickness of the entire package, which is conducive to the development of electronic products toward miniaturization and thinning.

The following three packaging embodiments are taken as examples to describe the packaging process of the present disclosure in detail, and may be suitable for packaging different chips.

FIG. 1a-1f show a first embodiment of the packaging method of the present disclosure.

Referring to FIG. 1a, a baseplate having an open slot 10a is provided. The baseplate comprises a circuit board 1a, and is formed therein with a circuit layout for wiring. The size and shape of the open slot 10a may be determined according to the type of the chip. The adhesive tape 2a is bonded to one side of the circuit board 1a and covers an opening on one side of the open slot 10a.

Figure 1B:
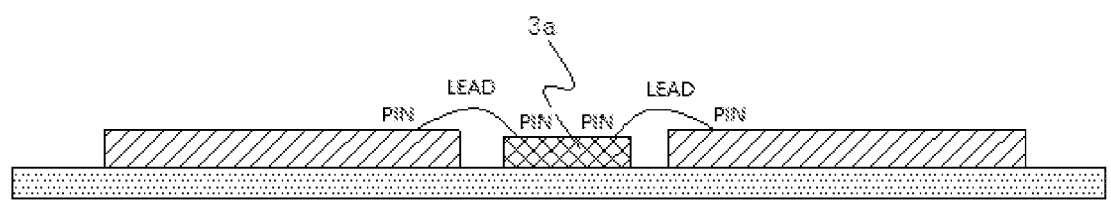

Referring to FIG. 1b, a first chip 3a is mounted on the adhesive tape 2a at the position of the open slot 10a, is located in the open slot 10a, and is bonded by the adhesive layer of the adhesive tape 2a. Wherein, the height of the first chip 3a has a height that may be greater than the thickness of the circuit board 1a, or may be equal to or less than the thickness of the circuit board 1a. After that, the pins of the first chip 3a are conducted to corresponding positions of the circuit board 1a through leads.

Figure 1C:
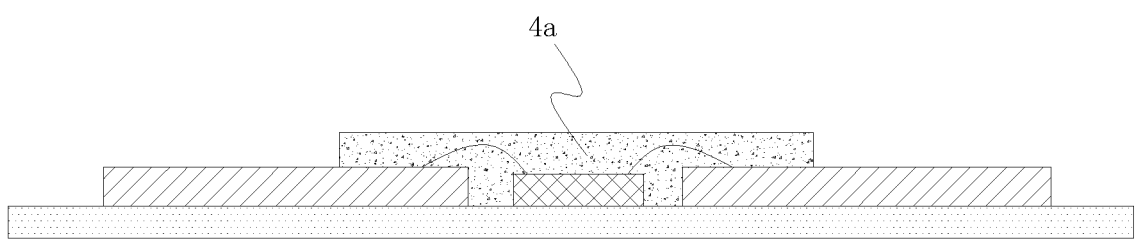

Referring to FIG. 1c, the first chip 3a is packaged from the side of the circuit board 1a facing away from the adhesive tape 2a. For example, the first chip 3a may be packaged through an injection molding process or a film-on-wire (FOW) process to obtain a first packaging layer 4a. For those skilled in the field of chip packaging, the injection molding process or the film-on-wire (FOW) process is a conventional technical means, which will not be described in detail herein.

The first packaging layer 4a packages both the first chip 3a and its pins on the circuit board 1a; in the mean time, the first packaging layer 4a fills a gap between the first chip 3a and the open slot 10a, thereby firmly combining the first chip 3a with the circuit board 1a together.

Figure 1D:
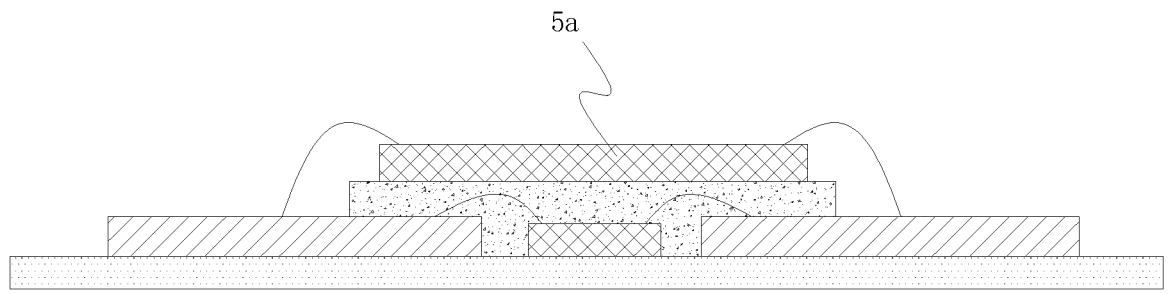

Referring to FIG. 1d, a second chip 5a is mounted on a surface of the first packaging layer 4a, and pins of the second chip 5a are conducted to the circuit board 1a through leads. The second chip 5a may be bonded to the top surface of the first packaging layer 4a in a manner well known to those skilled in the art, and the size of the second chip 5a is larger than those of the first chip 3a and the open slot 10a, constituting a typical packaging structure with a large top chip and a small bottom chip. With such a structural design, there is no need to worry about a series of problems resulting from vibration caused by hanging during performing pressure welding on the chip.

Figure 1E:
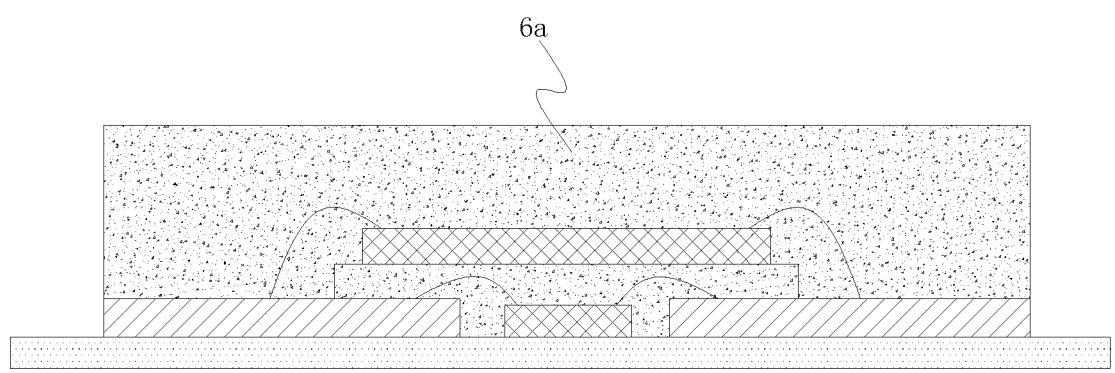

Referring to FIG. 1e, the second chip 5a undergoes a further packaging to obtain a second packaging layer 6a. The second packaging layer 6a may be formed by the injection molding process, and package the second chip 5a and its leads, as well as the first packaging layer 4a simultaneously on the circuit board 1a. The second packaging layer 6a and the first packaging layer 4a may adopt the same material and process, which will not be described in detail herein.

Figure 1F:
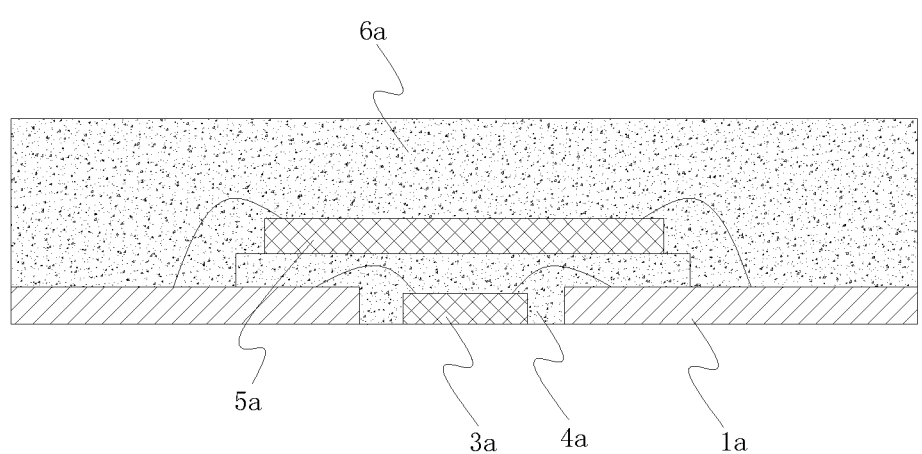

Referring to FIG. 1f, the adhesive tape 2a is removed to obtain the packaging structure of the chips. Since the adhesive tape 2a is bonded to the circuit board 1a, the first chip 3a, and the first packaging layer 4a only by its own weak adhesiveness, the adhesive tape 2a may be peeled off directly.

For those skilled in the art, a pyrolysis film, a photolysis film, or a baseplate containing a release layer may also be selected as a temporary carrier of the chips. For example, when the pyrolysis film is selected, it may be removed by heating; when the photolysis film is selected, it may be removed by irradiation. When the baseplate containing the release layer is selected as the temporary carrier, it may be removed in different ways according to the type of the release layer. For example, the release layer may be made of pyrolysis material or photolysis material, which will not be described in detail herein.

For those skilled in the art, a cutting step may also be included. The packaging structure obtained above is cut according to design requirements, so as to obtain an separate package.

In addition, the above steps may be applied to a large-scale production line to produce a large number of packages simultaneously, which will not be described in detail herein.

FIG. 2a-2f show a second embodiment of the packaging method of the present disclosure.

Figure 2A:
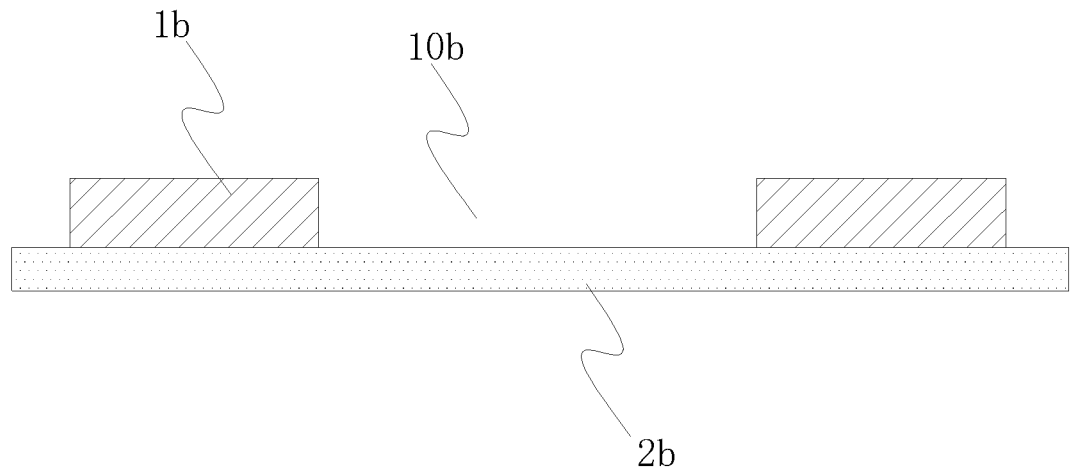
FIG. 2a to 2g are flow charts of the packaging process of a second embodiment of the present disclosure.

Referring to FIG. 2a, a baseplate having an open slot 10b is provided. The baseplate comprises a circuit board 1b, and is formed therein with a circuit layout for wiring. The size and shape of the open slot 10b may be determined according to the type of the chip. The pyrolysis film 2b is bonded to one side of the circuit board 1b and covers an opening on one side of the open slot 10b.

Figure 2B:
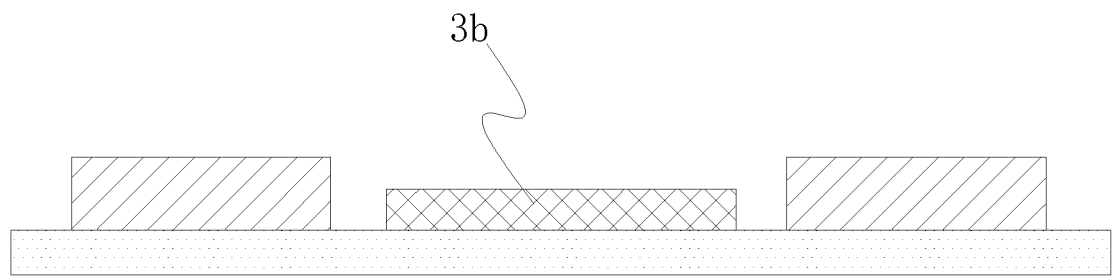

Referring to FIG. 2b, a first chip 3b is mounted on the pyrolysis film 2b at the position of the open slot 10b, and pins of the first chip 3b faces the pyrolysis film 2b. The first chip 3b is located in the open slot 10b, and is bonded by the adhesive layer of the pyrolysis film 2b. Wherein, the first chip 3b is of a height that may be greater than the thickness of the circuit board 1b, or may be equal to or less than the thickness of the circuit board 1b.

Figure 2C:
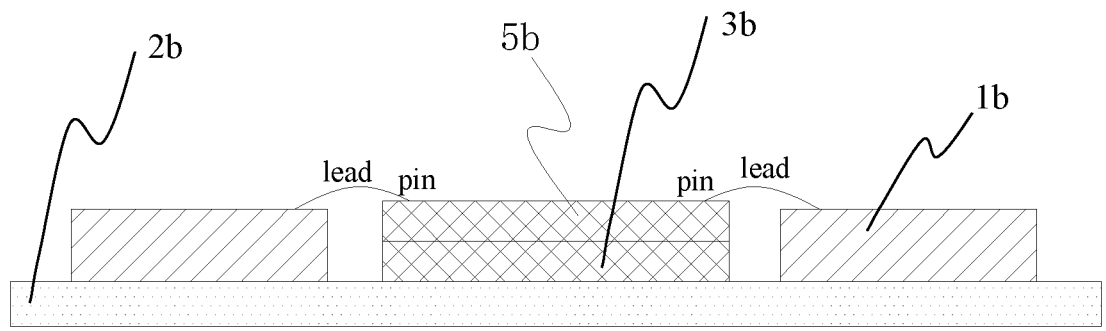
Figure 2D:
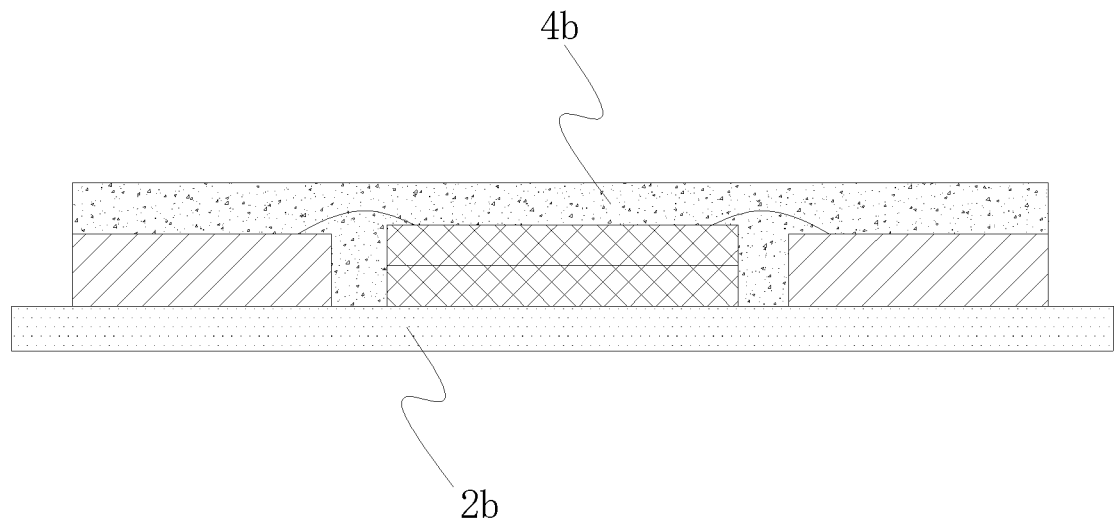
Figure 2E:
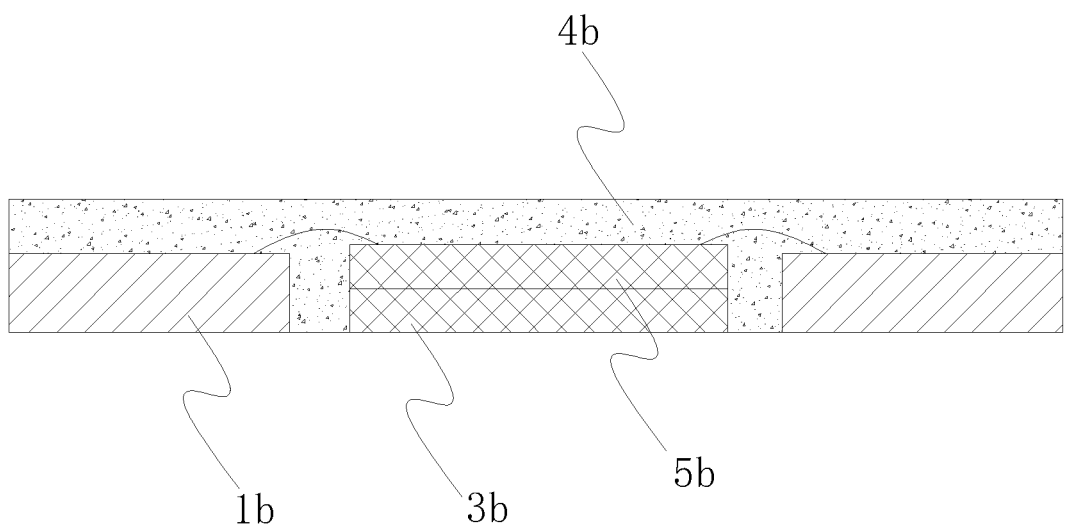

Referring to FIG. 2c, a second chip 5b is mounted on the top of the first chip 3b, may have the same size as that of the first chip 3b, and is mounted on the top surface of the first chip 3b in such a way that its pins face away from the pyrolytic film 2b. After that, the pins of the second chip 5b are conducted to the corresponding positions on the circuit board 1b through leads.

The first chip 3b may be located in the open slot 10b of the circuit board 1b, that is, the first chip 3b has a thickness smaller than that of the circuit board 1b. In this way, the second chip 5b may be at least partially located in the open slot 10b, so that the two chips are stacked in a manner of being embedded in the circuit board 1b.

Referring to 2d, the first chip 3b and the second chip 5b are packaged from the side of the circuit board 1b facing away from the pyrolytic film 2b. For example, the first chip 3b and the second chip 5b may be packaged through the injection molding process or the film-on-wire (FOW) process to obtain a first packaging layer 4b. For those skilled in the field of packaging a chip, the injection molding process or the film-on-wire (FOW) process is a conventional method, which will not be described in detail.

The first packaging layer 4b packages the first chip 3b, the second chip 5, as well as the pins of the second chip 5 on the circuit board 1b simultaneously; at the same time, the first packaging layer 4b will fill the gap between the chips and the open slot 10b, therefore firmly bonding the chips with the circuit board 1b together.

Referring to 2e, the pyrolysis film 2b is removed to obtain the packaging structure of the chips. For example, the pyrolysis film 2b may be easily removed from the circuit board 1b, the first chip 3b, and the first packaging layer 4b by heating.

For those skilled in the art, a photolytic film or a baseplate containing a release layer may be selected as a temporary carrier for the chips, which will not be described in detail herein.

Figure 2F:
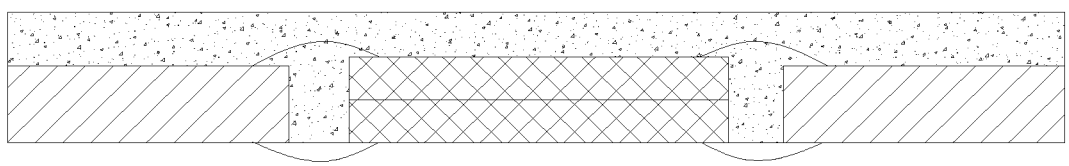

Referring to FIG. 2f, since the pyrolytic film 2b is removed, the lower surface of the first chip 3b is exposed. In this way, the pins on the lower surface of the first chip 3b may be conducted to the corresponding positions on the circuit board 1b through the leads.

Figure 2G:
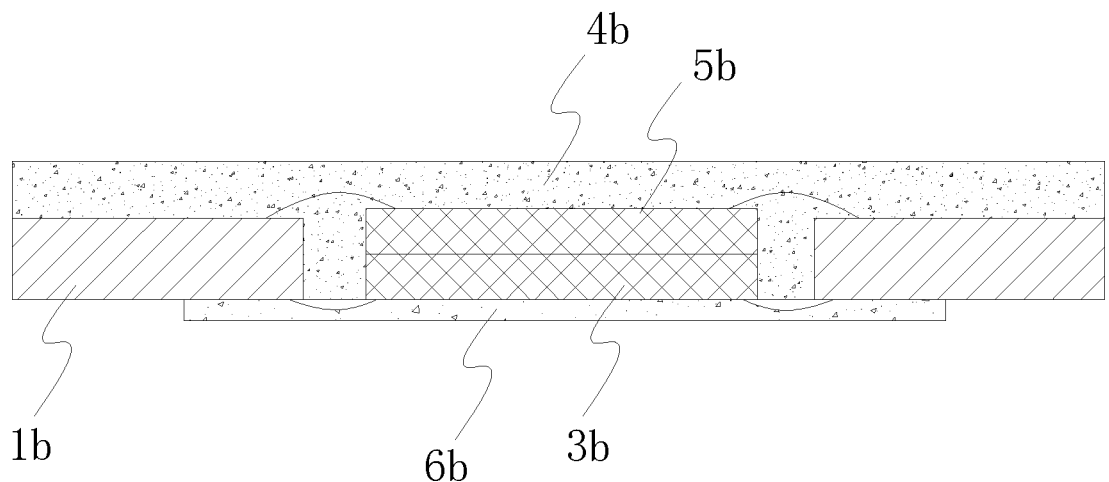

Referring to FIG. 2g, the first chip 3b and its leads are further packaged from the lower surface of the circuit board 1b to obtain a second packaging layer 6b. For example, it can be further packaged by a process of dispensing, injection molding, or film-on-wire. For those skilled in the field of packaging chips, the process of dispensing, injection molding, or film-on-wire (FOW) is a conventional method, which will not be described in detail.

The second packaging layer 6b packages the lower surface of the first chip 3b and its leads on the lower surface of the circuit board 1b simultaneously, therefore firmly combining the chips with the circuit board 1b together.

After that, a solder ball may be planted at a corresponding position on the lower surface of the circuit board 1b to facilitate the conduction between the package and an external circuit, which will not be described in detail herein.

Compared with a traditional packaging structure in which chips are stacked, the packaging structure of the present embodiment in which the embedded chips are stacked may greatly reduce the thickness of the package to meet the requirements for ultra-thin package.

FIG. 3a-3g show a third embodiment of the packaging method of the present disclosure.

Figure 3A:
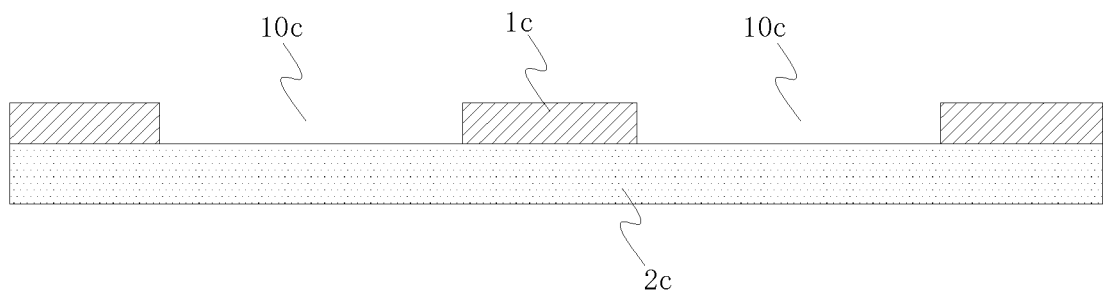
FIG. 3a to 3g are flow charts of the packaging process of a third embodiment of the present disclosure.

Referring to FIG. 3a, a baseplate 1c having an open slot 10b is provided. The open slot 10 has a size and shape that may be determined according to the type of a chip, and may be provided with a plurality of open slots. FIG. 3a shows a schematic diagram of two open slots 10c. A pyrolysis film 2c is bonded to one side of the baseplate 1c and covers one side of the open slot 10c.

Figure 3B:
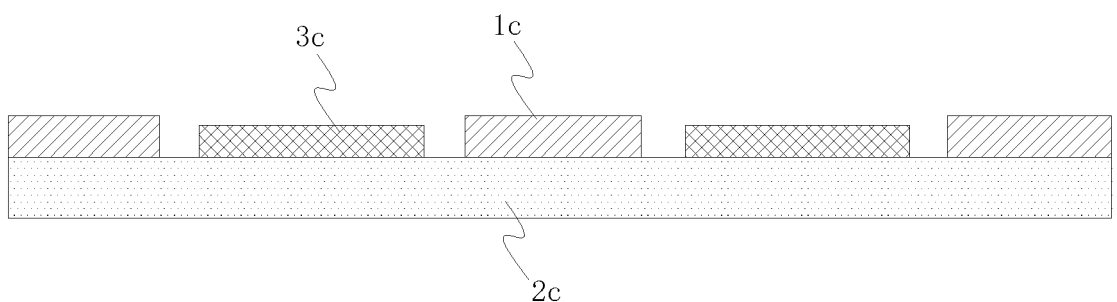

Referring to FIG. 3b, a chip 3c is mounted on the pyrolysis film 2c at the position of the open slot 10c, and pins of the chip 3c faces the pyrolysis film 2c. The chip 3c is located in the open slot 10c, and is bonded by the adhesive layer of the pyrolysis film 2c. Wherein, the chip 3c may have a height that is greater than the thickness of the baseplate 1c, or is equal to or less than the thickness of the baseplate 1c.

Figure 3C:
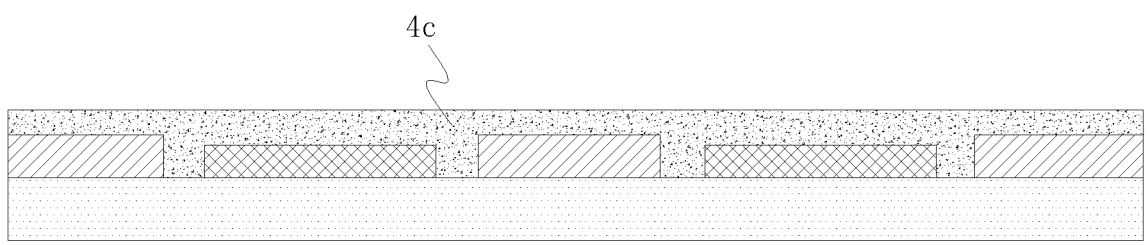

Referring to FIG. 3c, the chip 3c is packaged from the side of the baseplate 1c facing away from the pyrolytic film 2c. For example, the chip 3c may be packaged through the injection molding process or the film-on-wire (FOW) process to obtain a packaging layer 4c. For those skilled in the field of packaging a chip, the injection molding process or the film-on-wire (FOW) process is a conventional method, which will not be described in detail.

The packaging layer 4c packages the chip 3c on the baseplate 1c; at the same time, the packaging layer 4c will fill the gap between the chip 3c and the open slot 1c, thereby firmly combining the chip 3c and the baseplate 1c together.

Figure 3D:
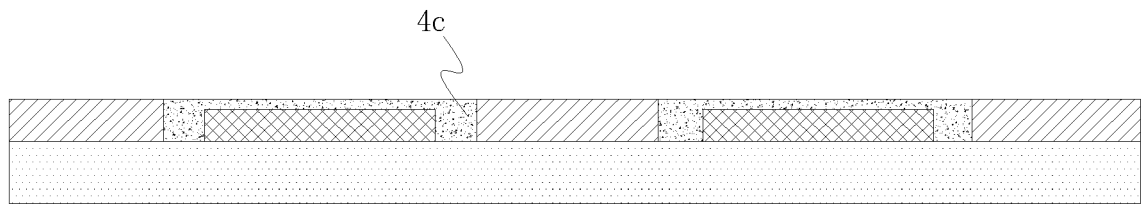

Referring to FIG. 3d, preferably, the outer surface of the packaging layer 4c may be thinned. For example, it can be thinned by grinding, and the thickness to be thinned may be determined according to actual needs. For example, the thickness of the chip 3c may be designed to be lower than or equal to the thickness of the baseplate 1c. In this way, the packaging layer 4c may be thinned to expose the surface of the baseplate 1c.

Figure 3E:
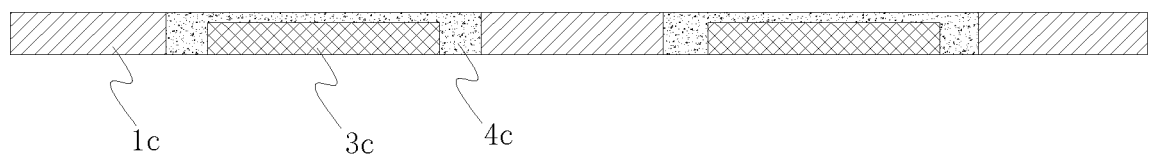

Referring to FIG. 3e, the pyrolysis film 2c is removed to obtain the packaging structure for a chip. For example, the pyrolysis film 2c may be easily removed from the baseplate 1c, the chip 3c, and the packaging layer 4c by heating.

For those skilled in the art, a photolytic film or a baseplate containing a release layer may be selected as a temporary carrier for the chips, which will not be described in detail herein.

Figure 3F:
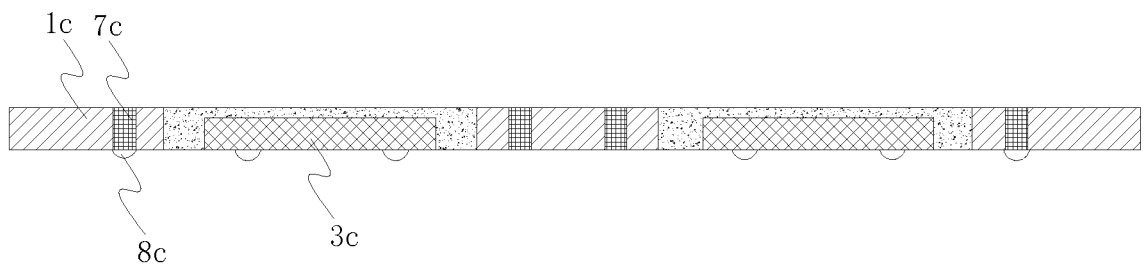

Referring to FIG. 3f, since the pyrolytic film 2b is removed, the lower surface of the chip 3c is exposed. A circuit may be routed on the baseplate 1c through a re-distribution procedure (RDL process) and be led out. For example, a conductive circuit 7c and a trace layer may be made on the baseplate 1c; finally, a solder ball 8c may be planted on the baseplate 1c and the chip 3c to facilitate the conduction between the package and an external circuit. The process of re-distribution on the baseplate is the common knowledge of those skilled in the art, which will not be described in detail herein.

Figure 3G:
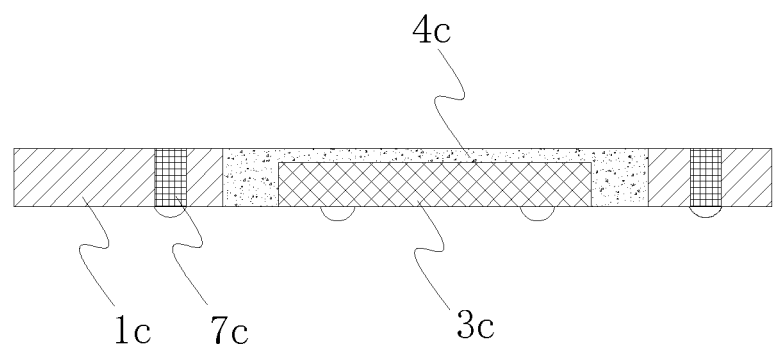

Referring to FIG. 3g, the baseplate 1c is cut along corresponding positions, so that a plurality of separate chip packages may be obtained.

The packaging process of this embodiment is a panel-level fan-out packaging, in which the chips are packaged in the open slot of the baseplate, so that the warpage of the package may be controlled; and the chips are placed by the bonding process, and thus have a high positioning accuracy; a PCB process can be used for the re-distributing manufacture procedure, leading to a high matching of equipment and materials and reduced processing costs.

While certain specific embodiments of the present disclosure have been illustrated by way of example, it will be understood by those skilled in the art that the foregoing examples are provided for the purpose of illustration and are not intended to limit the scope of the present disclosure. It will be understood by those skilled in the art that the foregoing embodiments may be modified without departing from the scope and spirit of the disclosure. The scope of the present disclosure is subject to the attached claims.

The invention claimed is:

1. A method for packaging a chip, comprising:
providing a baseplate formed with an open slot thereon penetrating through opposite sides of the baseplate;
providing a release base material, wherein the release base material is bonded to a first side of the baseplate and covers the open slot;
providing a first chip, wherein the first chip is mounted on the release base material at the position of the open slot;
packaging a second side of the baseplate facing away from the release base material so as to form a packaging layer which packages the first chip to be fixed on the baseplate; and
removing the release base material to obtain a package structure for the first chip;
wherein the providing the first chip further comprises mounting the first chip on the release base material in a manner in which pins thereon face the release base material, mounting a second chip on the first chip in a manner in which pins thereon face away from the release base material, wherein the pins of the second chip are conducted to the baseplate through respective leads;
wherein the packaging the second side of the baseplate further comprises, packaging the first chip, the second chip and the leads of the second chip and fixing all on the baseplate; and
the method further comprises after removing the release base material, conducting the pins of the first chip to the baseplate through leads, and packaging the first chip and its pins from the first side of the baseplate.

2. The method of claim 1 for packaging a chip, wherein a top surface of the first chip is flush with or lower than a top surface of the baseplate; and the method further comprises, after packaging the second side of the baseplate, thinning the packaging layer.

3. The method of claim 1 for packaging a chip, wherein the providing the first chip further comprises, mounting the first chip on the release base material in a manner in which pins thereon face the release base material; and the method further comprises, after the removing the release base material, performing re-distribution on the baseplate.

4. The method of claim 3 for packaging a chip, further comprising, after the performing re-distribution, performing cutting to obtain a plurality of separate packaging structures.

5. The method of claim 1 for packaging a chip, wherein the providing the first chip further comprises, conducting the first chip to the baseplate through respective leads; and wherein the packaging the second side of the baseplate further comprises, packaging the first chip and its leads and fixing both on the baseplate; and
further comprising mounting the second chip on the packaging layer and conducting the second chip to the baseplate through respective leads; and packaging the second chip, to form another packaging layer for packaging the second chip on the baseplate.

6. The method of claim 1 for packaging a chip, further comprising a further packaging of the first chip and its leads from the second side of the baseplate through a dispensing process.

7. The method of claim 1 for packaging a chip, the first chip having a size, wherein the second chip has the size.

8. The method of claim 1 for packaging a chip, wherein the packaging the second side of the baseplate is selected from the group consisting of, an injection molding process and a film-on-wire process.

9. The method of claim 1 for packaging a chip, wherein the release base material is selected from the group consisting of an adhesive tape, a pyrolysis film, a photolysis film, and a baseplate containing a release layer.

* * * * *